United States Patent [19]

Loerzer et al.

[11] Patent Number: 4,857,438
[45] Date of Patent: Aug. 15, 1989

[54] PHOTOCHROMIC SYSTEM AND LAYERS PRODUCED THEREWITH

[75] Inventors: Thomas Loerzer, Frankenthal; Reinhold J. Leyrer, Ludwigshafen, both of Fed. Rep. of Germany

[73] Assignee: BASF Aktiengesellschaft, Ludwigshafen, Fed. Rep. of Germany

[21] Appl. No.: 28,587

[22] Filed: Mar. 20, 1987

[30] Foreign Application Priority Data

Mar. 20, 1986 [DE] Fed. Rep. of Germany ....... 3609320

[51] Int. Cl.$^4$ .............................................. G03C 1/733
[52] U.S. Cl. .................................. 430/332; 430/343; 430/920
[58] Field of Search .................. 430/343, 920, 332

[56] References Cited

U.S. PATENT DOCUMENTS

| Re. 28,240 | 11/1974 | Jenkins | 430/343 |
|---|---|---|---|
| 3,445,234 | 5/1969 | Cescon et al. | 430/343 |
| 4,456,679 | 6/1984 | Leyrer et al. | 430/326 |
| 4,465,760 | 8/1984 | Leyrer et al. | 430/325 |
| 4,465,761 | 8/1984 | Takegawa et al. | 430/343 |
| 4,565,771 | 1/1986 | Lynch et al. | 430/307 |
| 4,579,806 | 4/1986 | Schupp et al. | 430/280 |

FOREIGN PATENT DOCUMENTS

| 3331691 | 9/1969 | Fed. Rep. of Germany . |
|---|---|---|
| 3231145 | 3/1979 | Fed. Rep. of Germany . |
| 3231147 | 2/1984 | Fed. Rep. of Germany . |
| 3231144 | 7/1987 | Fed. Rep. of Germany . |

*Primary Examiner*—Paul R. Michl
*Assistant Examiner*—Mark R. Buscher
*Attorney, Agent, or Firm*—Keil & Weinkauf

[57] ABSTRACT

A photochromic system contains an oxidizable leuco dye and a photochemically activated initiator which converts the leuco dye to the dye, the initiator being a phenanthroimidazole derivative.

The photochromic system is useful for the production of photochromic layers for photoresists and printing plates.

3 Claims, No Drawings

PHOTOCHROMIC SYSTEM AND LAYERS PRODUCED THEREWITH

The present invention relates to a novel photochromic system, photochromic layers produced therewith, and their use for the production of recording materials, in particular for lithographic layers and for other printing processes.

Image-forming compositions and processes play an important role in the use of recording materials, for example in the production of relief printing plates, lithographic printing plates, printed circuits etc. For these applications, these recording materials are exposed imagewise to actinic light while they are in contact with an image-bearing transparency. Exposure is usually carried out by contact exposure or by the reflex copy process. After exposure, recording materials of this type are developed, for example, by washing out with solvents, dusting on pigments or making use of the different adhesion of exposed and unexposed parts of the layer. In assessing the imagewise exposure of a recording material, it is important to produce a color change in the layer as a result of the exposure to actinic light. In this way, it is possible, for example, to distinguish unexposed and exposed areas from one another. Defects which are attributable, for example, to soiled originals can thus readily be detected. Moreover, the image produced by exposure can be used for adjustment, which is necessary in certain applications.

The photochromic dye system must meet various requirements in order to be suitable for use in the above-mentioned fields. The spectral sensitivity should be in the range 250–400 nm in order to utilize the commercial light sources in an optimum manner. The spectral sensitivity should, where appropriate, extend up to the limit of visible light. Furthermore, the photochromic system should have a long shelf life even when exposed to heat.

U.S. Pat. No. 3,445,234 discloses that hexaarylbisimidazoles in conjunction with aminotriarylmethanes, eg. crystal violet leucobase, can be used as a photochromic dye system. The disadvantage of this system is that the photochemical oxidizing agent hexaarylbisimidazole undergoes thermal decomposition to give free radicals and there is therefore a need for special stabilizers to prevent or restrict this thermal color change.

It is an object of the present invention to provide a photochromic dye system for coating and recording materials which are solid at room temperature, the said system possessing high spectral sensitivity coupled with a longer shelf life.

We have found that this object is achieved, and that, surprisingly, 2-phenylphenanthroimidazoles which are substituted in the 1-position of the imidazole ring, in conjunction with crystal violet leucobase, give recording materials which have an extremely long shelf life and give a very good color change only when exposed to actinic light.

The present invention relates to a photochromic system containing an oxidizable leuco dye and a photochemically activated initiator which converts the leuco dye to the dye, wherein the initiator is a compound of the general formula (I) or (II)

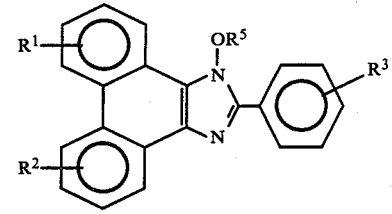

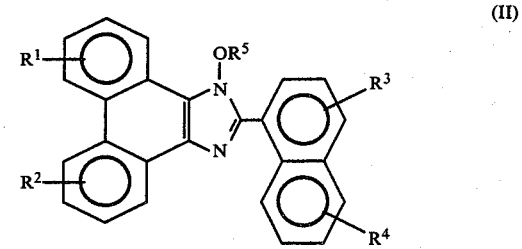

wherein $R^1$, $R^2$, $R^3$ and $R^4$ are identical or different and are each hydrogen, alkyl, alkoxy, halogen or amino, $R^5$ is hydrogen, alkyl, alkoxy, aralkyl, alkylsulfonyl, arylsulfonyl, dialkoxyphosphoryl, dialkylphosphoryl, diarylphosphoryl or a carbonyl radical

and $R^6$ is alkyl, alkoxy, phenyl or dialkylamino.

The present invention furthermore relates to photochromic layers which contain a photochromic system of this type, one or more film-forming polymers and other conventional additives, and a process for the production of the lithographic layers for photoresists, offset printing, letterpress printing and gravure printing and for etching glass or aluminum using these photochromic layers.

For example, 1-methoxy-2-phenylphenanthroimidazole or 1-(N,N-dibutylaminocarbonyloxy)-2-phenylphenanthroimidazole in combination with crystal violet leucobase give recording materials which have an excellent shelf life and produce a clearly detectable color change only when exposed to actinic light.

These phenanthroimidazole derivatives can be activated by actinic light having a wavelength of from 250 to 400 nm and are converted to reactive species capable of oxidizing substituted aminotriarylmethanes, for example bis(4-diethylaminophenyl)phenylmethane, tris(4-diethylaminophenyl)methane or tris(4-dimethylaminophenyl)methane.

Regarding the novel photochromic system and the components of the photochromic layers, the following may be stated specifically.

Examples of suitable leuco dyes are
aminotriarylmethane compounds,
aminoxanthene compounds,
aminothioxanthene compounds,
amino-9,10-dihydroacridine compounds,
aminophenoxazine compounds,
aminophenothiazine compounds,
aminodihydrophenazine compounds,
aminodiphenylmethane compounds,
leucoindamine compounds,
aminohydrocinnamic acids, hydrazines,
leuco indigoid dyes,
amino-2,3-dihydroanthraquinones,
tetrahalo-p,p'-bihenols,
2-(p-hydroxyphenyl)-4,5-diphenylimidazoles and phenethylaniline compounds.

The following may be mentioned here: aminotriarylmethane compounds, such as
bis-(4-amino-2-butylphenyl)-(p-dimethylaminophenyl)-methane,
bis-(4-amino-2-chlorophenyl)-(p-aminophenyl)-methane,
bis-(4-amino-3-chlorophenyl)-(o-chlorophenyl)-methane,
bis-(4-amino-3,5-diethylphenyl)-(o-chlorophenyl)-methane,
bis-(4-amino-3,5-diethylphenyl)-(o-ethoxyphenyl)-methane,
bis-(4-amino-3,5-diethylphenyl)-(p-methoxyphenyl)-methane,
bis-(4-amino-3,5-diethylphenyl)-phenylmethane,
bis-(4-amino-3-ethylphenyl)-(o-chlorophenyl)-methane,
bis-(p-aminophenyl)-(4-amino-m-tolyl)-methane,
bis-(p-aminophenyl)-(o-chlorophenyl)-methane,
bis-(p-aminophenyl)-(p-chlorophenyl)-methane,
bis-(p-aminophenyl)-(2,4-dichlorophenyl)-methane,
bis-(p-aminophenyl)-2,5-dichlorophenyl)-methane,
bis-(p-aminophenyl)-(2,6-dichlorophenyl)-methane,
bis-(p-aminophenyl)-phenylmethane,
bis-(4-amino-o-tolyl)-(p-chlorophenyl)-methane,
bis-(4-amino-o-tolyl)-(2,4-dichlorophenyl)-methane,
bis-(p-anilinophenyl)-(4-amino-m-tolyl)-methane,
bis-(4-benzylamino-2-cyanophenyl)-(p-aminophenyl)-methane,
bis-(p-benzylethylaminophenyl)-(p-chlorophenyl)-methane,
bis-(p-benzylethylaminophenyl)-(p-diethylaminophenyl)-methane,
bis-(p-benzylethylaminophenyl)-(p-dimethylaminophenyl)-methane,
bis-(4-benzylethylamino-o-tolyl)-(p-methoxyphenyl)-methane,
bis-(p-benzylethylaminophenyl)-phenylmethane,
bis-(4-benzylethylamino-o-tolyl)-(o-chlorophenyl)-methane,
bis-(4-benzylethylamino-o-tolyl)-(p-diethylaminophenyl)-methane,
bis-(4-benzylethylamino-o-tolyl)-(p-diethylaminophenyl)-methane,
bis-(4-benzylethylamino-o-tolyl)-(4-diethylamino-o-tolyl)-methane,
bis-(4-benzylethylamino-o-tolyl)-(p-dimethylaminophenyl)-methane,
bis-[2-chloro-4-(2-diethylaminoethyl)-ethylaminophenyl](o-chlorophenyl)-methane,
bis-[p-bis-(2-cyanoethyl)-aminophenyl]-phenylmethane,
bis-[p-(2-cyanoethyl)-ethylamino-o-tolyl]-(p-dimethylaminophenyl)-methane,
bis-[p-(2-cyanoethyl)-methylaminophenyl]-(p-diethylaminophenyl)-methane,
bis-(p-dibutylaminophenyl)-[p-(2-cyanoethyl)-methylaminophenyl]-methane,
bis-(p-dibutylaminophenyl)-(p-dietylaminophenyl)-methane,
bis-(4-diethylamino-2-butoxyphenyl)-(p-diethylaminophenyl)-methane,
bis-(4-diethylamino-2-fluorophenyl)-o-tolyl-methane,
bis-(p-diethylaminophenyl)-(p-aminophenyl)-methane,
bis-(p-diethylaminophenyl)-(4-aniline-1-naphthyl)-methane,
bis-(p-diethylaminophenyl)-(m-butoxyphenyl)-methane,
bis-(p-diethylaminophenyl)-(o-chlorophenyl)-methane,
bis-(p-diethylaminophenyl)-(p-cyanophenyl)-methane,
bis-(p-diethylaminophenyl)-(2,4-dichlorophenyl)-methane,
bis-(p-diethylaminophenyl)-(4-diethylamino-1-naphthyl)-methane,
bis-(p-diethylaminophenyl)-(p-dimethylaminophenyl)-methane,
bis-(p-diethylaminophenyl)-(4-ethylamino-1-naphthyl)-methane,
bis-(p-diethylaminophenyl)-2-naphthylmethane,
bis-(p-diethylaminophenyl)-(p-nitrophenyl)-methane,
bis-(p-diethylaminophenyl)-2-pyridylmethane,
bis-(p-diethylamino-m-tolyl)-(p-diethylaminophenyl)-methane,
bis-(4-diethylamino-o-tolyl)-(o-chlorophenyl)-methane,
bis-(4-diethylamino-o-tolyl)-(p-diethylaminophenyl)-methane,
bis-(4-diethylamino-o-tolyl)-(p-diphenylaminophenyl)-methane,
bis-(4-diethylamino-o-tolyl)-phenylmethane,
bis-(4-dimethylamino-2-bromophenyl)-phenyl-methane,
bis-(p-dimethylaminophenyl)-(4-anilino-1-naphthyl)-methane,
bis-(p-dimethylaminophenyl)-(p-butylaminophenyl)-methane,
bis-(p-dimethylaminophenyl)-(p-sec.-butylethylaminophenyl)-methane,
bis-(p-dimethylaminophenyl)-(p-chlorophenyl)-methane,
bis-(p-dimethylaminophenyl)-(p-diethylaminophenyl)-methane,
bis-(p-dimethylaminophenyl)-(4-dimethylamino-1-naphthyl)-methane,
bis-(p-dimethylaminophenyl)-(6-dimethylamino-m-tolyl)-methane,
bis-(p-dimethylaminophenyl)-(4-dimethylamino-o-tolyl)-methane,
bis-(p-dimethylaminophenyl)-(4-ethylamino-1-naphthyl)-methane,
bis-(p-dimethylaminophenyl)-(p-hexyloxyphenyl)-methane,
bis-(p-dimethylaminophenyl)-(p-methoxyphenyl)-methane,
bis-(p-dimethylaminophenyl)-(5-methyl-2-pyridyl)-methane,
bis-(p-dimethylaminophenyl)-2-quinolylmethane,
bis-(p-dimethylaminophenyl)-o-tolylmethane,
bis-(p-dimethylaminophenyl)-(1,3,3-trimethyl-2-indolinylidenemethyl)-methane,
bis-(4-dimethylamino-o-tolyl)-(p-aminophenyl)-methane,
bis-(4-dimethylamino-o-tolyl)-(o-bromophenyl)-methane,
bis-(4-dimethylamino-o-tolyl)-(o-cyanophenyl)-methane,
bis-(4-dimethylamino-o-tolyl)-(o-fluorophenyl)-methane,
bis-(4-dimethylamino-o-tolyl)-1-naphthylmethane,
bis-(4-dimethylamino-o-tolyl)-phenylmethane,
bis-(p-ethylaminophenyl)-(o-chlorophenyl)-methane,
bis-(4-ethylamino-m-tolyl)-(o-methoxyphenyl)-methane, bis-(4-ethylamino-m-tolyl)-(p-methoxyphenyl)-methane,
bis-(4-ethylamino-m-tolyl)-(p-dimethylaminophenyl)-methane,
bis-(4-ethylamino-m-tolyl)-(p-hydroxyphenyl)-methane,
bis-[4-ethyl-(2-hydroxyethyl)-amino-m-tolyl]-(p-diethylaminophenyl)-methane,
bis-[p-(2-hydroxyethyl)-aminophenyl]-(o-chlorophenyl)methane,
bis-[p-(bis-(2-hydroxyethyl)-aminophenyl]-(4-diethylamino-o-tolyl)-methane,
bis-[p-(2-methoxyethyl)-aminophenyl]-phenylmethane,
bis-(p-methylaminophenyl)-(o-hydroxyphenyl)-methane,
bis-(p-propylaminophenyl)-(m-bromophenyl)-methane,
tris-(4-amino-o-tolyl)-methane,
tris-(4-aniline-o-tolyl)-methane,
tris-(p-benzylaminophenyl)-methane,
tris-(4-bis-(2-cyanoethyl)-amino-o-tolyl]-methane,
tris-[p-(2-cyanoethyl)-ethylaminophenyl]-methane,
tris-(4-dimethylaminophenyl)-methane,
tris-(p-dibutylaminophenyl)-methane,
tris-(p-di-tert.-butylaminophenyl)-methane,
tris-(4-diethylamino-2-chlorophenyl)-methane,
tris-(p-diethylaminophenyl)-methane,
tris-(4-diethylamino-o-tolyl)-methane,
tris-(p-dihexylamino-o-tolyl)-methane,
tris-(4-dimethylamino-o-tolyl)-methane,
tris-(p-hexylaminophenyl)-methane,
tris-[p-bis-(2-hydroxyethyl)-aminophenyl]-methane,
tris-(p-methylaminophenyl)-methane and
tris-(p-dioctadecylaminophenyl)-methane;
aminoxanthene compounds, such as 3-amino-6-dimethylamino-2-methyl-9-(o-chlorophenyl)-xanthene,
3-amino-6-dimethylamino-2-ethyl-9-phenyl-xanthene,
3-amino-6-dimethylamino-2-methylxanthene,
3,6-bis-(diethylamino)-9-(o-chlorophenyl)-xanthene,
3,6-bis-(diethylamino)-9-hexylxanthene,
3,6-bis-(diethylamino)-9-(o-methoxycarbonylphenyl)-xanthene,
3,6-bis-(diethylamino)-9-methylxanthene,
3,6-bis-(diethylamino)-9-phenylxanthene,
3,6-bis-(diethylamino)-9-o-tolylxanthene,
3,6-bis-(dimethylamino)-9-(o-chlorophenyl)-xanthene,
3,6-bis-(diethylamino)-9-ethylxanthene,
3,6-bis-(diethylamino)-9-(o-methoxycarbonylphenyl)-xanthene and
3,6-bis-(dimethylamino)-9-methylxanthene; aminothioxanthene compounds, such as
3,6-bis-(diethylamino)-9-(o-ethoxycarbonylphenyl)-thioxanthene,
3,6-bis-(dimethylamino)-9-(o-methoxycarbonylphenyl)-thioxanthene,
3,6-dianiline-9-(o-ethoxycarbonylphenyl)-thioxanthene,
amino-9,10-dihydroacridine compounds,
3,6-bis-(benzylamino)-9,10-dihydro-9-methylacridine,
3,6-bis-(diethylamino)-9-hexyl-9,10-dihydroacridine,
3,6-bis-(diethylamino)-9,10-dihydro-9-methylacridine,
3,6-bis-(diethylamino)-9,10-dihydro-9-phenylacridine,
3,6-diamino-9-hexyl-9,10-dihydroacridine,
3,6-diamino-9,10-dihydro-9-methylacridine,
3,6-diamino-9,10-dihydro-9-phenylacridine,
3,6-bis-(dimethylamino)-9-hexyl-9,10-dihydroacridine and
3,6-bis-(dimethylamino)-9,10-dihydro-9-methylacridine;
aminophenoxazine compounds, such as
3,7-bis-(diethylamino)-phenoxazine and
9-dimethylamino-benzo[a]phenoxazine;
aminophenothiazine compounds, such as
3,7-bis-(benzylamino)-phenothiazine;
aminodihydrophenazine compounds, such as
3,7-bis-(benzylethylamino)-5,10-dihydro-5-phenylphenazine,
3,7-bis-(diethylamino)-5-hexyl-5,10-dihydrophenazine,
3,7-bis-(dihexylamino)-5,10-dihydrophenazine,
3,7-bis-(dimethylamino-(5-(p-chlorophenyl)-5,10-dihydrophenazine,
3,7-diamino-5-(o-chlorophenyl)-5,10-dihydrophenazine,
3,7-diamino-5,10-dihydrophenazine,
3,7-diamino-5,10-dihydro-5-methylphenazine,
3,7-diamino-5-hexyl-5,10-dihydrophenazine,
3,7-bis-(dimethylamino)-5,10-dihydrophenazine,
3,7-bis-(dimethylamino)-5,10-dihydro-5-phenylphenazine and
3,7-bis-(dimethylamino)-5,10-dihydro-5-methylphenazine;
aminodiphenylmethane compounds, such as
1,4-bis-[bis-p-(diethylaminophenyl)-methyl]-piperazine,
bis-(p-diethylaminophenyl)-anilinomethane,
bis-(p-diethylaminophenyl)-1-benzotriazolylmethane,
bis-(p-diethylaminophenyl)-2-benzotriazolylmethane,
bis-(p-diethylaminophenyl)-(p-chloroaniline)-methane,
bis-(p-diethylaminophenyl)-(2,4-dichloroaniline)-methane,
bis-(p-diethylaminophenyl)-(methylamino)-methane,
bis-(p-diethylaminophenyl)-(octadecylamino)-methane,
bis-(p-dimethylaminophenyl)-aminomethane,
bis-(p-dimethylaminophenyl)-anilinemethane,
1,1-bis-(dimethylaminophenyl)-ethane,
1,1-bis-(dimethylaminophenyl)-heptane and
bis-(4-methylamino-m-tolyl)-aminoethane;
leucoindamine compounds, such as
4-amino-4'-dimethylaminodiphenylamine and p-(p-dimethylaminoanilino)-phenol; aminohydrocinnamic acids (cyanoethanes, leucomethines), such as
methyl 4-amino-alpha-beta-dicyanohydrocinnamate,
methyl 4-anilino-alpha,beta-dicyanohydrocinnamate,
methyl 4-(p-chloroanilino-alpha,beta-dicyanohydrocinnamate,
alpha-cyano-4-dimethylaminohydrocinnamide,
methyl alpha-cyano-4-dimethylaminohydrocinnamate,
methyl alpha,beta-dicyano-4-diethylaminohydrocinnamate,
alpha,beta-dicyano-4-dimethylaminohydrocinnamide,
methyl alpha,beta-dicyano-4-dimethylaminohydrocinnamate,
alpha,beta-dicyano-4-dimethylaminohydrocinnamic acid,
hexyl alpha,beta-dicyano-4-dimethylaminohydrocinnamate,
methyl alpha,beta-dicyano-4-ethylaminohydrocinnamate,
methyl alpha,beta-dicyano-4-hexylaminohydrocinnamate,
methyl alpha,beta-dicyano-4-methylaminocinnamate,
p-(2,2-dicyanoethyl)-N,N-dimethylaniline,
4-methoxy-4'-(1,2,2-tricyanoethyl)-azobenzene,
4-(1,2,2-tricyanoethyl)-azobenzene and
p-(1,2,2-tricyanoethyl)-N,N-dimethylaniline, hydrazines, such as
1-(p-diethylaminophenyl)-2-(pyrid-2-yl)-hydrazine,
1-(p-dimethylaminophenyl)-2-(pyrid-2-yl)-hydrazine, 1-(3-methyl-2-benzothiazolyl)-2-(4-hydroxy-naphth-1-yl)-hydrazine,
1-(naphth-2-yl)-2-phenylhydrazine,
1-p-nitrophenyl-2-phenylhydrazine and
1-(1,3,3-trimethyl-indolin-2-yl)-2-(3-N-phenylcarbamyl-4-hydroxy-naphth-1-yl)-hydrazine;
amino-2,3-dihydroanthraquinones, such as
1,4-dianilino-2,3-dihydroanthraquinone and
1,4-bis-(ethylamino)-2,3-dihydroanthraquinone;
phenethylaniline compounds, such as
N-(2-cyanoethyl)-p-phenethylaniline,
N,N-diethyl-p-phenylethylaniline,
N,N-dimethyl-p-[2-(naphth-1-yl)-ethyl]-aniline,
N,N-dimethyl-p-[2-(4-nitro-naphth-1-yl)-ethyl]-aniline,
N,N-dimethyl-p-phenethylaniline,
N,N-dimethyl-p-[2-(4-methoxy-naphth-1-yl)-ethyl]-aniline,
p-(p-methoxyphenethyl)-aniline,
p-[2-(naphth-1-yl)-ethyl]-aniline,
p-(p-nitrophenethyl)-aniline and
p-phenethylaniline, and
if appropriate, mixtures of these leuco dyes.

Suitable novel photochemically activated initiators are compounds of the general formula (I) or (II)

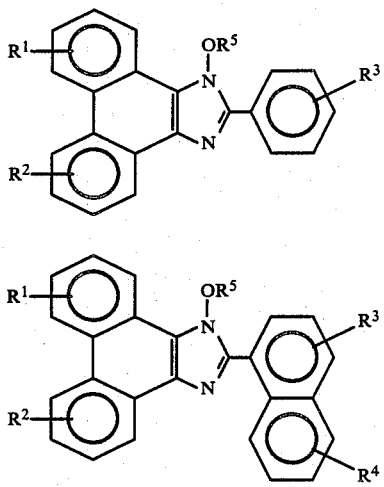

where $R^1$, $R^2$, $R^3$ and $R^4$ are identical or different and are each hydrogen, alkyl, alkoxy, halogen or amino, $R^5$ is hydrogen, alkyl, alkoxy, aralkyl, alkylsulfonyl, arylsulfonyl, dialkoxyphosphoryl, dialkylphosphoryl, diarylphosphoryl or a carbonyl radical

and $R^6$ is alkyl, alkoxy, phenyl or dialkylamino.

Suitable alkyl radicals $R^1$, $R^2$, $R^3$, $R^4$ and $R^5$ are straight-chain or branched alkyl of 1 to 18, preferably 1 to 6, carbon atoms and cyclohexyl, eg. methyl, ethyl, n-propyl, isopropyl, n-butyl, isobutyl, tert.-butyl, pentyl, hexyl, heptyl, octyl, isooctyl, 2-ethylhexyl, decyl, undecyl, dodecyl or stearyl, suitable alkoxy radicals $R^1$, $R^2$, $R^3$, $R^4$ and $R^5$ are straight-chain or branched alkoxy with 1 to 18, preferably 1 to 6, carbon atoms, eg. methoxy, ethoxy, propoxy, butoxy, pentyloxy or hexyloxy, suitable halogen radicals $R^1$, $R^2$, $R^3$ and $R^4$ are fluorine, chlorine, bromine and iodine, preferably chlorine, suitable amino radicals $R^1$, $R^2$, $R^3$ and $R^4$ are —$NH_2$ and mono- and dialkylamino where alkyl is of 1 to 6 carbon atoms, and suitable aralkyl radicals $R^5$ are, for example, benzyl radicals.

In the carbonyl radicals $R^5$ of the formula

$R^6$ is alkyl of 1 to 18, preferably 1 to 12, carbon atoms, alkoxy of 1 to 18, preferably 1 to 6, carbon atoms, phenyl or dialkylamino where alkyl is of 1 to 6 carbon atoms; examples of $R^6$ are methyl, butyl, trimethylphenyl and toluyl; examples of suitable alkylsulfonyl radicals $R^5$ are those where alkyl is of 1 to 18, preferably 1 to 6, carbon atoms; examples of suitable arylsulfonyl radicals $R^5$ are phenylsulfonyl and 4-methylphenylsulfonyl; examples of suitable dialkoxyphosphoryl radicals $R^5$ are those where alkoxy is of 1 to 12, preferably 1 to 6, carbon atoms; examples of suitable dialkylphosphoryl radicals $R^5$ are those where alkyl is of 1 to 12, preferably 1 to 6, carbon atoms and an example of a suitable diarylphosphoryl radical $R^5$ is diphenylphosphoryl.

Examples of photochemically activated initiators of formula (I) or (II) are
1-methoxy-2-phenylphenanthroimidazole,
1-benzyloxy-2-phenylphenanthroimidazole,
1-(N,N-dibutylaminocarbonyloxy)-2-phenylphenanthroimidazole,
1-acetoxy-2-phenylphenanthroimidazole and
1-acetoxy-2-(2-chlorophenyl)-phenanthroimidazole.

The photochemically activated initiator is combined with the leuco dye in general in a weight ratio of from 1:1 to 10:1.

The novel photochromic system is preferably used for the production of photochromic layers. The latter contain, in addition to the photochromic system, one or more film-forming polymers and other conventional additives, such as crosslinking agents, reactive chain extenders, plasticizers, stabilizers, photo initiators and mixtures of these.

The photochromic layers contain in general from 0.01 to 10%, preferably from 0.1 to 1%, of a leuco dye and from 0.1 to 20%, preferably from 0.5 to 5%, of a photochemically activated initiator.

Suitable film-forming polymers are the conventional homopolymers and copolymers, provided that they have the properties desired for this field of use, for example homopolymers and copolymers of acrylates or methacrylates of monoalkanols of 1 to 8 carbon atoms, eg. methanol, butanol or 2-ethylhexyl alcohol, copolymers of vinyl aromatics, eg. styrene or vinyltoluene, vinyl ester copolymers, vinyl chloride and vinylidene chloride copolymers, N-vinylpyrrolidone (co)polymers, partially hydrolyzed polyvinyl acetate, olefin/(meth) acrylate copolymers and olefin/vinyl ester copolymers, suitable olefins being ethylene, propylene and/or butadiene. These copolymers may also contain functional groups, such as —COOH, —OH and/or —$NH_2$, by incorporating, as copolymerized units, monomers which possess corresponding groups.

Other suitable film-forming polymers are polycondensates and polyadducts, such as polyesters, polyurethanes and in particular nylons. Particularly preferred film-forming polymers, which are usually applied to the substrate to be coated, for example a polyester film or aluminum, in the form of their solution (in acetone, methylene chloride, tetrahydrofuran, ethyl acetate or methyl ethyl ketone as a solvent) and are dried, or, for example, copolymers of methyl methacrylate with acrylic acid, styrene and hydroxypropyl acrylate.

The other conventional additives vary depending on the specific intended use.

Where the layers in question are photopolymerizable ones, they contain photopolymerizable monomers, such as polyfunctional acrylates and/or methacrylates, for example the esters of acrylic acid or methacrylic acid with dihydric or polyhydric alcohols, such as ethylene glycol, propylene glycol, butanediol, hexanediol, trimethylolpropane, glycerol, pentaerythritol and the like, the reaction products of (poly)epoxide compounds with (meth)acrylic acid, urethane acrylates, unsaturated polyesters and mixtures of the abovementioned polyfunctional compounds with monofunctional compounds, such as esters of acrylic acid or methacrylic acid with $C_1$—$C_{20}$-monoalkanols, vinyl esters, vinylaromatics and/or N-vinyllactams, eg. N-vinylpyrrolidone.

Other possible additives are assistants and additives such as stabilizers, further photoinitiators and sensitizers, which are generally used in minor amounts.

The novel photochromic layers can be used, for example, for the production of lithographic layers for photoresists, offset printing, letterpress printing, gravure printing and etching (for example on glass or aluminum). These processes are described in, for example, German Laid-Open Applications DOS 3,231,145, DOS 3,231,147, DOS 3,331,691 and DOS 3,231,144.

The novel photochromic systems are distinguished in particular by their long shelf life. They are particularly useful for negative-working photoresist films.

In the Comparative Example and in the Examples, parts and percentages are by weight, unless stated otherwise.

COMPARATIVE EXAMPLE

A mixture consisting of 55 parts of polymethyl methacrylate (eg. Degalan$^{(R)}$ LP 50/09), 18 parts of trimethylolpropane triacrylate, 13.5 parts of butanediol diacrylate, 9.4 parts of p-toluenesulfonamide, 0.15 part of Michler's ketone, 3.4 parts of benzophenone and 0.45 part of crystal violet leucobase in 155 parts of ethyl acetate was prepared, and 3 parts of 2,2'-bis-(2-chlorophenyl)-4,4',5,5'-tetrakis-(4-methoxyphenyl)-bisimidazole were added. The solution was stirred for four hours, filtered through a pressure filter having a pore diameter of 1 μm and cast as a layer on a 0.023 mm thick polyester film (eg. Melinex®S 23 from ICI) in an amount such that, after drying with warm air, a resist film 0.035 mm thick remained. The resist film was laminated with brushed copper at 120° C. and at 1.5 m.min$^{-1}$ in a commercial laminator (eg. HOT-ROLL laminator HRL 24). The photoresist was exposed for from 1 to 3 minutes through a photographic transparency of an electric circuit diagram, in a conventional flat-plate exposure unit (eg. MOLL flatplate exposure unit). A good color contrast between exposed and unexposed parts of the image was obtained. The copper plate coated with this resist film was stored at 50° C. After no longer than 10 days, the photoresist film had a very pronounced blue coloration.

EXAMPLE 1

A resist film was produced as described in the Comparative Example, but with 2.5 parts of 1-methoxy-2-phenylphenanthroimidazole instead of 3 parts of the hexaarylbisimidazole stated there. Imagewise exposure gave very good color contrast between exposed and unexposed image areas, which appears to correspond virtually completely with the color contrast of Comparative Example 1. Storage at elevated temperatures as a test for the shelf life showed that this novel dye system is substantially better than the system described in Comparative Example 1. Thus, the resist layer showed no discoloration even after storage at 50° C. for three weeks.

EXAMPLE 2

The photochemical oxidizing agent 1-(N,N-dibutylaminocarbonyloxy)-2-phenylphenanthroimidazole showed similar behavior to the 1-methoxy-2-phenylphenanthroimidazole stated in Example 1.

EXAMPLES 3–8

In order to characterize the photochemically active oxidizing agents from the series consisting of the phenanthroimidazoles, exposure series were carried out. The resist layers had the composition described in Comparative Example 1, except that, instead of the hexaarylbisimidazoles stated there, 2.5 parts of the phenanthroimidazole stated in the Table were used. Exposure was effected using a commercial flat-plate exposure unit. The ΔOD values stated (change in the optical density after an exposure time of 1 minute or 3 minutes) give the extinction of the photochemically produced crystal violet at 600 nm; they are therefore a measure of the photochemical oxidizing power of the phenanthroimidazole derivatives used.

| Example | Photooxidizing agent | ΔOD after 1 minute | ΔOD after 3 minutes |
|---------|---------------------|---------------------|----------------------|
| 3 | (phenanthroimidazole with OCH₃) | 0.3 | 0.5 |
| 4 | (phenanthroimidazole with OCH₂Ph) | | 0.1 |
| 5 | (phenanthroimidazole with OC(O)CH₃) | | 1.3 |

-continued

| Example | Photooxidizing agent | ΔOD after 1 minute | ΔOD after 3 minutes |
|---|---|---|---|
| 6 | 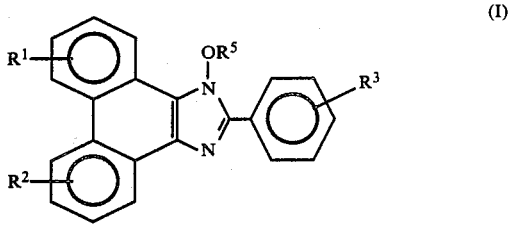 | | 1.3 |
| 7 | | | 1.4 |
| 8 | | 0.3 | 0.5 |

EXAMPLE 9

Instead of 2-methoxy-2-phenylphenanthroimidazole, 0.5 part of 1-hydroxy-2-phenylphenanthroimidazole was used in the above formulation. This compound too gave an excellent color change.

We claim:

1. A photochromic composition containing an oxidizable leuco dye and a photochemically activated initiator which converts the leuco dye to the dye, wherein the initiator is a compound of the formula (I) or (II)

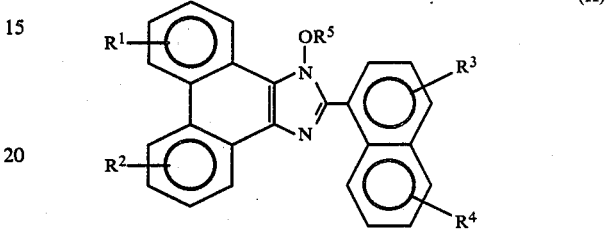

where $R^1$, $R^2$, $R^3$ and $R^4$ are identical or different and are each hydrogen, alkyl, alkoxy, halogen or amino, $R^5$ is hydrogen, alkyl, aralkyl, alkylsulfonyl, arylsulfonyl, dialkoxyphosphoryl, dialkylphosphoryl, diarylphosphoryl or a carbonyl radical $$-\underset{\underset{O}{\|}}{C}-R^6,$$

and $R^6$ is alkyl, alkoxy, phenyl or dialkylamino.

2. A photochromic layer which contains a photochromic composition and one or more film-forming polymers, wherein the said photochromic layer contains the photochromic composition defined in claim 1.

3. A process for the production of a lithographic layer for photoresist, offset printing, letter press printing or gravure printing or for etching glass or aluminum, wherein a photochromic layer as defined in claim 2 is subjected to actinic light through an image-bearing transparency, whereby the photochromic layer provides good color contrast between the exposed and unexposed image areas.

* * * * *